(12) United States Patent
Shim et al.

(10) Patent No.: US 10,319,447 B2
(45) Date of Patent: Jun. 11, 2019

(54) STORAGE DEVICE

(71) Applicant: SAMSUNG ELECTRONICS CO., LTD., Suwon-si, Gyeonggi-Do (KR)

(72) Inventors: Young-Seop Shim, Seoul (KR); Jaehong Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 8 days.

(21) Appl. No.: 15/493,860

(22) Filed: Apr. 21, 2017

(65) Prior Publication Data

US 2017/0371742 A1    Dec. 28, 2017

(30) Foreign Application Priority Data

Jun. 27, 2016 (KR) .................. 10-2016-0080281

(51) Int. Cl.
*G06F 11/10* (2006.01)
*G11C 16/26* (2006.01)
*G11C 16/34* (2006.01)
*G11C 16/04* (2006.01)

(52) U.S. Cl.
CPC .......... *G11C 16/26* (2013.01); *G06F 11/1048* (2013.01); *G11C 16/349* (2013.01); *G11C 16/3436* (2013.01); *G11C 16/0483* (2013.01)

(58) Field of Classification Search
CPC .................................................. G06F 11/1076
USPC ........................................ 714/764, 767, 768
See application file for complete search history.

(56) References Cited

U.S. PATENT DOCUMENTS

| | | | |
|---|---|---|---|
| 7,116,607 B2 | 10/2006 | Lee et al. | |
| 7,679,133 B2 | 3/2010 | Son et al. | |
| 7,826,263 B2 | 11/2010 | Lee et al. | |
| 7,876,620 B2 | 1/2011 | Mokhlesi et al. | |
| 8,243,515 B2 | 8/2012 | Park | |
| 8,281,220 B2 | 10/2012 | Kitahara | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,730,721 B2 | 5/2014 | Camp et al. | |
| 9,009,566 B2 * | 4/2015 | Hung | G06F 11/1048 714/764 |
| 9,015,407 B1 * | 4/2015 | Dusija | G06F 12/0246 711/100 |
| 9,092,310 B2 | 7/2015 | Zhang et al. | |
| 9,093,171 B2 | 7/2015 | Kim et al. | |
| 9,183,939 B2 | 11/2015 | Nam et al. | |

(Continued)

*Primary Examiner* — Fritz Alphonse
(74) *Attorney, Agent, or Firm* — F. Chau & Associates, LLC

(57) ABSTRACT

A storage device includes a nonvolatile memory device and a controller. A nonvolatile memory device includes a plurality of memory blocks. Each of the plurality of memory blocks is divided into a plurality of zones and is formed on a substrate. Each of the plurality of zones comprises one or more word lines. A controller performs a reliability verification read operation on a first zone of the plurality of zones of a memory block selected from the plurality of memory blocks if a number of read operations performed on the first zone reaches a first threshold value and performs the reliability verification read operation on a second zone of the plurality of zones of the selected memory block if a number of read operations performed on the second zone reaches a second threshold value.

17 Claims, 14 Drawing Sheets

(56) References Cited

U.S. PATENT DOCUMENTS

| | | |
|---|---|---|
| 9,240,241 B2 | 1/2016 | Costa et al. |
| 9,898,207 B2 * | 2/2018 | Kim ...................... G06F 3/0611 |
| 2011/0233648 A1 | 9/2011 | Seol et al. |
| 2014/0226398 A1 | 8/2014 | Desireddi et al. |
| 2015/0006792 A1 | 1/2015 | Lee et al. |
| 2015/0206590 A1 | 7/2015 | Sakuma et al. |
| 2015/0286407 A1 | 10/2015 | Zhang et al. |
| 2016/0062830 A1 * | 3/2016 | Cha ........................ G11C 29/52 |
| | | 714/764 |
| 2016/0070496 A1 | 3/2016 | Cohen et al. |
| 2016/0093394 A1 * | 3/2016 | Lee ........................ G11C 16/26 |
| | | 365/185.12 |

* cited by examiner

STORAGE DEVICE

CROSS-REFERENCE TO RELATED APPLICATION

This application claims priority under 35 U.S.C. § 119 to Korean Patent Application No. 10-2016-0080281 filed Jun. 27, 2016, in the Korean Intellectual Property Office, the disclosure of which is incorporated by reference herein in its entirety.

TECHNICAL FILED

The present inventive concept relates to a storage device.

DISCUSSION OF RELATED ART

Semiconductor memory devices refer to memory devices that are implemented using semiconductors such as silicon (Si), germanium (Ge), gallium arsenide (GaAs), indium phosphide (InP), or the like. Semiconductor memory devices are classified into volatile memory devices and nonvolatile memory devices.

The volatile memory devices lose data stored therein at power-off. The volatile memory devices includes a static random access memory (SRAM), a dynamic ram (DRAM), a synchronous DRAM, and the like. The nonvolatile memory devices retain data stored therein even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

In particular, the flash memory device is widely used in various electronic products as a mass storage device. Even though the flash memory device is a nonvolatile memory device, data stored in the flash memory device may be lost due to various factors, such as a temperature, read or program disturbance, and charge loss.

SUMMARY

According to an exemplary embodiment of the present inventive concept, a storage device is provided as follows. A nonvolatile memory device includes a plurality of memory blocks. Each of the plurality of memory blocks is divided into a plurality of zones and is formed on a substrate. Each of the plurality of zones comprises one or more word lines. A controller performs a reliability verification read operation on a first zone of the plurality of zones of a memory block selected from the plurality of memory blocks if a number of read operations performed on the first zone reaches a first threshold value and performs the reliability verification read operation on a second zone of the plurality of zones of the selected memory block if a number of read operations performed on the second zone reaches a second threshold value.

According to an exemplary embodiment of the present inventive concept, a storage device is provided as follows. A nonvolatile memory device includes a plurality of memory block zones each of which includes one or more memory blocks. A controller performs a reliability verification read operation on a memory block zone among the plurality of memory block zones if a number of read operations performed on the memory block zone reaches a threshold value and perform a read reclaim operation on the memory block zone based on a number of error bits detected through the reliability verification read operation.

According to an exemplary embodiment of the present inventive concept, a storage device is provided as follows. A nonvolatile memory device includes a plurality of word lines vertically stacked on a substrate. Each of the plurality of word lines is associated with one of a plurality of zones divided according to a height of each of the plurality of word lines from the substrate. A controller includes a count management unit. The count management unit stores a plurality of threshold values each of which is associated with one of the plurality of zones, generates a plurality of read counts by counting a read command for each of the plurality of zones and performs a reliability verification read operation on one or more word lines associated with a first zone of the plurality of zones if a read count of the first zone is greater than a threshold value of the first zone.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
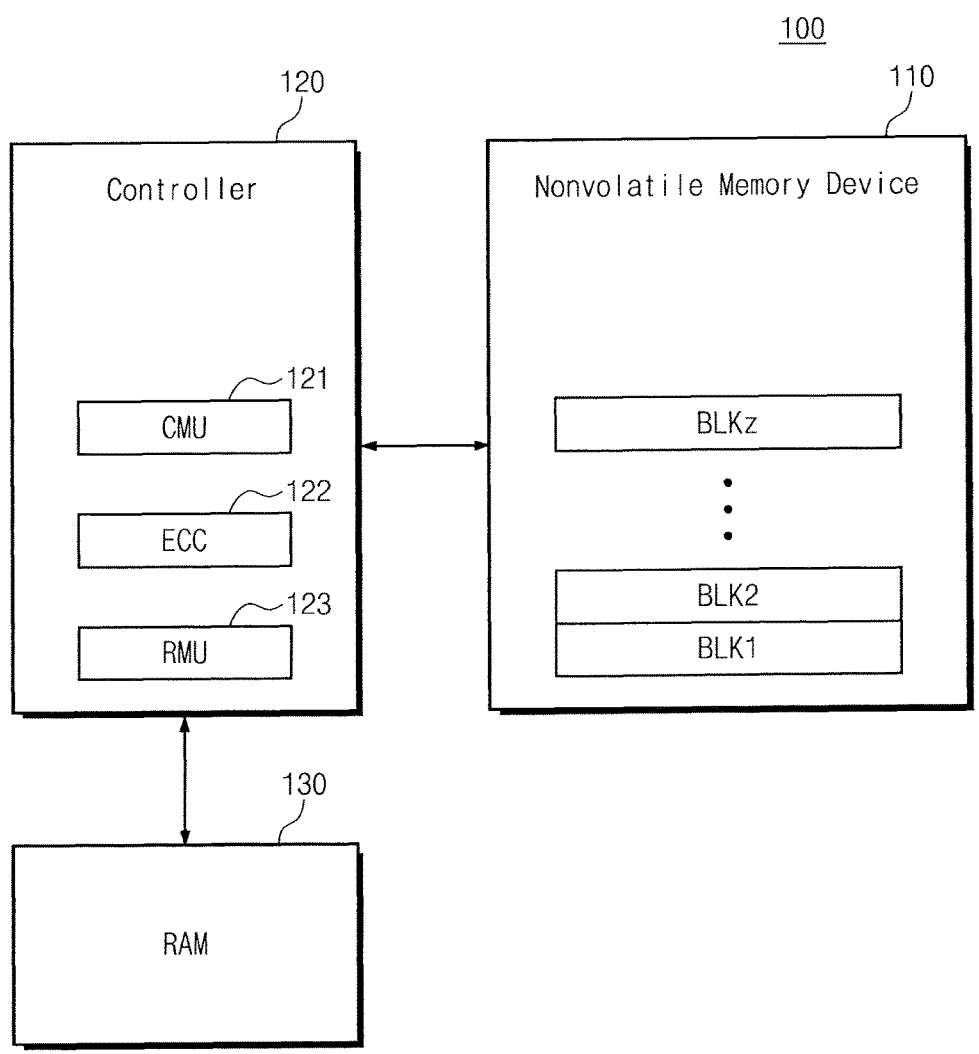
FIG. 1 is a block diagram illustrating a storage device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram illustrating a storage device 100 according to an exemplary embodiment of the inventive concept. Referring to FIG. 1, the storage device 100 may include a nonvolatile memory device 110, a controller 120, and a random access memory (RAM) 130. For example, the storage device 100 may be one of a solid state drive (SSD) and a secure digital (SD) card.

The nonvolatile memory device 110 may perform a write operation, a read operation, and an erase operation under control of the controller 120. The nonvolatile memory device 110 may receive a write command, an address, and data from the controller 120 and may write the data in a storage space selected by the address. The nonvolatile memory device 110 may receive a read command and an address from the controller 120, may read data from a storage space distinguished by the address, and may output the read data to the controller 120. The nonvolatile memory device 110 may receive an erase command and an address from the controller 120 and may erase data of a storage space selected by the address.

The nonvolatile memory device 110 may include a plurality of memory blocks BLK1 to BLKz (z being an integer of 2 or more). Each of the memory blocks BLK1 to BLKz may include a plurality of memory cells. The plurality of memory cells may form a storage space of the nonvolatile memory device 110. Each of the memory blocks BLK1 to BLKz may further include selection transistors that make it possible to select memory cells independently of each other. The memory blocks BLK1 to BLKz may have an operational characteristic or a structural characteristic of the nonvolatile memory device 110.

Any area of the memory blocks BLK1 to BLKz may store zone information about word lines. For example, the area may be a security area. The security area may store information about a bad area. The bad area may be an area that is determined as having low reliability, and memory cells included in the bad area may be unusable. In addition, the security area may store zone information about word lines. However, the present inventive concept is not limited thereto. For example, the zone information may be stored in a read only memory (ROM) of the nonvolatile memory device 110.

The zone information may mean information about a plurality of zones that are determined based on read disturbance characteristics of memory cells connected to each word line. The read disturbance may occur whenever a read operation is performed on a memory block. The read disturbance may stress out memory cells that are not selected as a read target. For example, the read disturbance may cause a change in threshold voltages of unselected memory cells. If the read disturbance is accumulated, an error may occur at data stored in unselected memory cells.

The influence of the read disturbance may vary according to locations of word lines. For this reason, the word lines may be classified into a plurality of zones based on the influence of the read disturbance. The word lines that are classified into the plurality of zones may be managed differently from each other. If the storage device 100 is connected with a host device, the nonvolatile memory device 110 may provide the zone information to the controller 120. The zone information will be more fully described with reference to FIG. 4.

The memory blocks BLK1 to BLKz may be provided based on a NAND flash memory. However, the present inventive concept is not limited thereto. For example, the memory blocks BLK1 to BLKz may be provided based on at least one of a NOR flash memory, a magnetic RAM (MRAM), a phase change RAM (PRAM), a resistive RAM (RRAM), and a ferroelectric RAM (FRAM).

The controller 120 may manage the storage device 100 by using the RAM 130. For example, the controller 120 may temporarily store data to be written in the nonvolatile memory device 110 or data read from the nonvolatile memory device 110 in the RAM 130. The controller 120 may load data, which is needed to manage the nonvolatile memory device 110, on the RAM 130.

The controller 120 may include a count management unit (CMU) 121 for securing the integrity of data stored in the nonvolatile memory device 110, an error correction code (ECC) circuit 122, a reclaim management unit (RMU) 123.

The count management unit 121 and the reclaim management unit 123 may be implemented in the form of hardware or software or in a hybrid form.

In the hardware form, the count management unit 121 and the reclaim management unit 123 may include one or more digital and/or analog circuits to perform operations to be described later. In the software form, the count management unit 121 and the reclaim management unit 123 may include one or more instruction codes for performing operations to be described later. The instruction codes may be complied or translated to an instruction set by one or more processors included in the controller 120 for processing.

The count management unit 121 may count the number of times that a read command is received from the host device. According to an exemplary embodiment of the inventive concept, a count associated with the read command may be a "read count".

In the case where a read count value reaches a threshold value, the count management unit 121 may perform a reliability verification read operation on a specific word line. For example, the count management unit 121 may perform the reliability verification read operation on the specific word line based on zone information received from the nonvolatile memory device 110. The reliability verification read operation will be more fully described with reference to FIGS. 5 to 7.

The ECC circuit 122 may detect and correct an error of data read from the nonvolatile memory device 110. For example, data stored in the nonvolatile memory device 110 may include an error due to various factors such as deterioration due to program and read operations, a temperature, and a time. The ECC circuit 122 may detect and correct an error included in data. The ECC circuit 122 may detect an error of data read from the nonvolatile memory device 110 through the reliability verification read operation. The reliability verification read operation may include operations of reading data from memory cells connected to any word line and measuring a bit error rate of the read data.

In the case where an error included in data read from the nonvolatile memory device 110 is greater than or equal to a reference value (e.g., the number of error bits is greater than or equal to the reference number of error bits), the reclaim management unit 123 may move data of a memory block, which includes memory cells storing read data, or a portion of data stored therein to another memory block. For example, in the case where data including a plurality of error bits exceeds an error correction capability of the ECC circuit 122, the reclaim management unit 123 may move data of a memory block to another memory block to maintain the integrity of data. The data movement operation may be referred to as "read reclaim".

For example, the reclaim management unit 123 of the controller 120 according to an exemplary embodiment of the inventive concept may perform the read reclaim or partial read reclaim.

Figure 2:
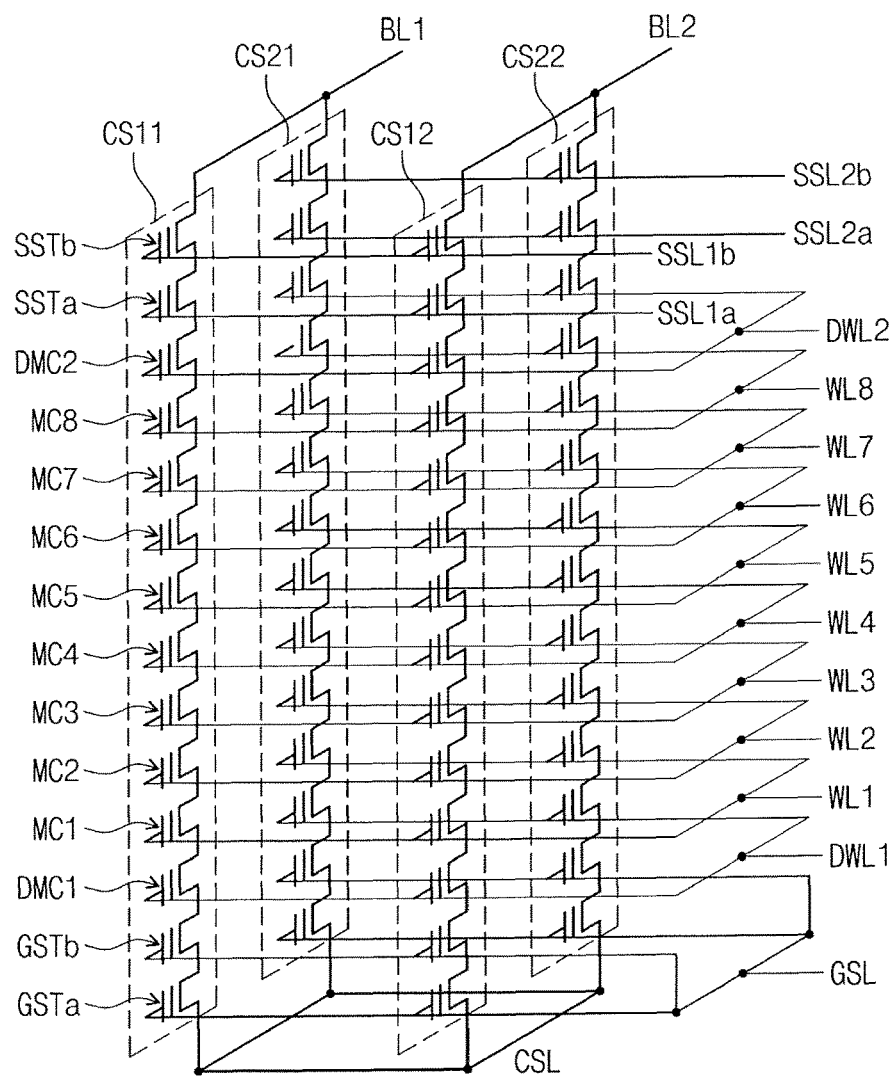
FIG. 2 is a circuit diagram illustrating a memory block included in a nonvolatile memory device of FIG. 1.
Figure 2:
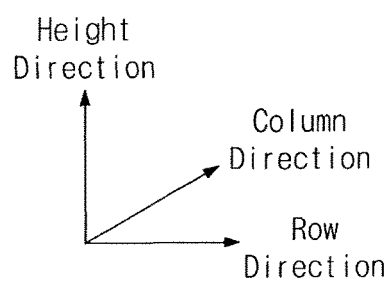

FIG. 2 is a circuit diagram illustrating a memory block included in a nonvolatile memory device of FIG. 1. A memory block BLKz having a three-dimensional (3D) structure will be described with reference to FIG. 2. However, the present inventive concept is not limited thereto, and the remaining memory blocks BLK1 to BLKz-1 may have the same or similar structures as that of the memory block BLKz. Referring to FIG. 2, the memory block BLKz includes a plurality of cell strings CS11, CS12, CS21, and CS22. The cell strings CS11, CS12, CS21, and CS22 may be arranged along a row direction and a column direction to form rows and columns.

Each of the cell strings CS11, CS12, CS21, and CS22 may include a plurality of cell transistors. For example, each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2. In an exemplary embodiment, each of the memory cells MC1 to MC8 included in the cell strings CS11, CS12, CS21, and CS22 may be a charge trap flash (CTF) memory cell.

In each cell string, the memory cells MC1 to MC8 may be serially connected to each other and may be stacked in a height direction that is a direction perpendicular to a plane defined by the row direction and the column direction. In each cell string, the string selection transistors SSTa and SSTb may be serially connected to each other and may be arranged between the memory cells MC1 to MC8 and a bit line BL. In each cell string, the ground selection transistors GSTa and GSTb may be serially connected to each other and may be arranged between the memory cells MC1 to MC8 and a common source line CSL.

In an exemplary embodiment, in each cell string, a first dummy memory cell DMC1 may be arranged between the memory cells MC1 to MC8 and the ground selection transistors GSTa and GSTb. In an exemplary embodiment, in each cell string, a second dummy memory cell DMC2 may be arranged between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In an exemplary embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In an exemplary embodiment, although not illustrated in FIG. 2, ground selection transistors at the same height from a substrate (not illustrated) may be connected to the same ground selection line, and ground selection transistors at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells of the same height from the substrate or the ground selection transistors GSTa and GSTb may be connected in common to the same word line, and memory cells of different heights therefrom may be connected to different word lines. For example, the first to eighth memory cells MC1 to MC8 in the cell strings CS11, CS12, CS21, and CS22 may be connected in common to first to eighth word lines WL1 to WL8, respectively.

First string selection transistors, which belong to the same row, from among the first string selection transistors SSTa at the same height may be connected to the same string selection line, and first string selection transistors belonging to different rows may be connected to different string selection lines. For example, the first string selection transistors SSTa of the cell strings CS11 and CS12 in the first row may be connected in common to a string selection line SSL1a, and the first string selection transistors SSTa of the cell strings CS21 and CS22 in the second row may be connected in common to a string selection line SSL2a.

Likewise, second string selection transistors, which belong to the same row, from among the second string selection transistors SSTb at the same height may be connected to the same string selection line, and second string selection transistors in different rows may be connected to different string selection lines. For example, the second string selection transistors SSTb of the cell strings CS11 and CS12 in the first row may be connected in common to a string selection line SSL1b, and the second string selection transistors SSTb of the cell strings CS21 and CS22 in the second row may be connected in common to a string selection line SSL2b.

Although not shown in FIG. 2, string selection transistors of cell strings in the same row may be connected in common to the same string selection line. For example, the first and second string selection transistors SSTa and SSTb of the cell strings CS11 and CS12 in the first row may be connected in common to the same string selection line. The first and second string selection transistors SSTa and SSTb of the cell strings CS21 and CS22 in the second row may be connected in common to the same string selection line.

In an exemplary embodiment, dummy memory cells at the same height may be connected with the same dummy word line, and dummy memory cells at different heights may be connected with different dummy word lines. For example, the first dummy memory cells DMC1 may be connected with the first dummy word line DWL1, and the second dummy memory cells DMC2 may be connected with the second dummy word line DWL2.

In an exemplary embodiment, the memory block BLKz illustrated in FIG. 2 is only exemplary. The number of cell strings may increase or decrease, and the number of rows of cell strings and the number of columns of cell strings may increase or decrease according to the number of cell strings. Also, in the memory block BLKz, the number of cell transistors (GST, MC, DMC, SST, etc.) may increase or decrease. Also, a height of the memory block BLKz may increase or decrease according to the number of cell transistors. Furthermore, the number of lines (GSL, WL, DWL, SSL, etc.) connected with cell transistors may increase or decrease according to the number of cell transistors.

The following patent documents, which are hereby incorporated by reference, describe suitable configurations for 3D memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
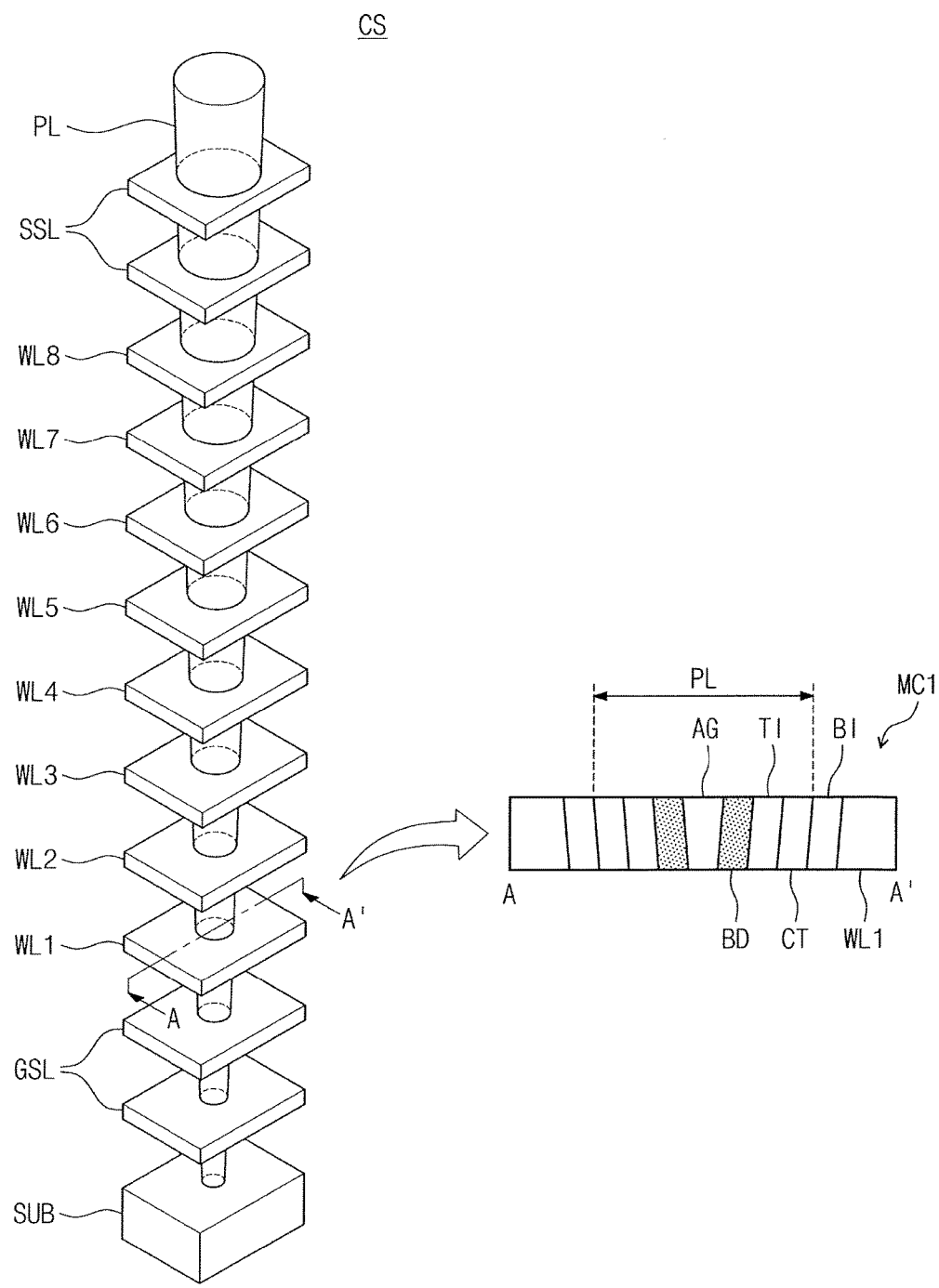
FIG. 3 is a conceptual diagram illustrating an example of a structure of a cell string in a memory block of FIG. 2.

FIG. 3 is a conceptual diagram illustrating an example of a structure of a cell string in a memory block of FIG. 2. Referring to FIGS. 2 and 3, a pillar PL is provided on a substrate SUB such that it extends in a direction perpendicular to the substrate SUB to make contact with the substrate SUB. Each of a ground selection line GSL, word lines WL1 to WL8, and string selection lines SSL may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along line A-A' is illustrated in FIG. 3. In an exemplary embodiment, a sectional view of a first memory cell MC1 corresponding to a first word line WL1 is illustrated. The pillar PL may include a cylindrical body BD. An air gap AG may be defined in the interior of the body BD. The body BD may include P-type silicon and may be an area where if the first memory cell MC1 is turned on, a channel is formed. The pillar PL may further include a cylindrical tunnel insulating layer TI surrounding the body BD and a cylindrical charge trap layer CT surrounding the cylindrical tunnel insulating layer TI. A blocking insulating layer BI may be provided between the first word line WL and the pillar PL. The body BD, the cylindrical tunnel insulating layer TI, the cylindrical charge trap layer CT, the blocking insulating layer BI, and the first word line WL may constitute a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

In the process of manufacturing the cell string CS, a width of the pillar PL or a cross-sectional area of the pillar PL which is parallel with the upper surface of the substrate SUB may become smaller as a distance from the substrate SUB decreases. For example, the pillar PL penetrating the plurality of word lines may have a decreasing width toward the substrate SUB. Accordingly, when the same voltage is applied to bodies of the ground selection transistors GST, the memory cells MC1 to MC8, and the string selection transistors SST and the same voltage is applied to the ground selection line GSL, the word lines WL1 to WL8, and the string selection lines SSL, an electric field formed at a memory cell adjacent to the substrate SUB or at the ground selection transistor GST may be greater than an electric field formed at a memory cell distant from the substrate SUB or at the string selection transistor SST. The above-described characteristic may have an influence on the read disturbance that is generated while a read operation is performed. For example, the ground selection transistors GST may include the ground selection transistors GSTa and GSTb of CS11 as shown in FIG. 2; the string selection transistors SST may include the string selection transistors SSTa and SSTa of CS11. In this case, the string selection lines SSL may include string selection lines SSL1a and SSL1b; the ground selection line may include two layers for the ground selection transistors GSTa and GSTb, respectively and the two layers are electrically connected to each other, as shown in FIG. 2.

Figure 4:
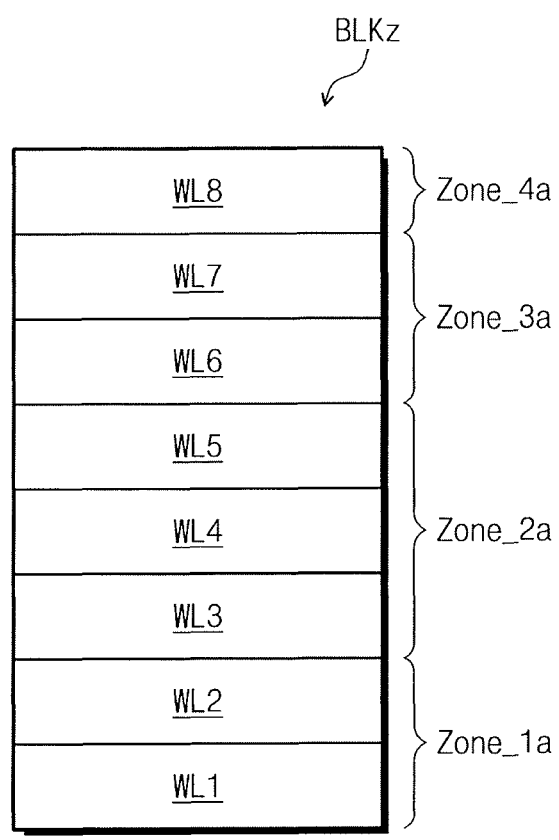
FIG. 4 is a block diagram illustrating a memory block divided into a plurality of zones, according to an exemplary embodiment of the inventive concept.

FIG. 4 is a block diagram illustrating a memory block divided into a plurality of zones, according to an exemplary embodiment of the inventive concept. As illustrated in FIG. 4, the memory block BLKz may be divided into a plurality of zones Zone_1a to Zone_4a. Each of the remaining memory blocks BLK1 to BLKz-1 may be divided into a plurality of zones Zone_1a to Zone_4a in a manner similar to or the same as the memory block BLKz.

Referring to FIGS. 2, 3, and 4, the zones Zone_1a to Zone_4a may be determined based on the influence of the read disturbance. For example, the zones Zone_1a to Zone_4a may be determined according to a distance between the word lines WL1 to WL8 and the substrate SUB. First and second word lines WL1 and WL2 of which the distance from the substrate SUB is the shortest may be classified as a first zone Zone_1a.

On the basis of distances from the substrate SUB, third, fourth, and fifth word lines WL3, WL4, and WL5 may be classified as a second zone Zone_2a, sixth and seventh word lines WL6 and WL7 as a third zone Zone_3a, and an eighth word line WL8 as a fourth zone Zone_4a. For example, the read disturbance of a word line closer to the substrate SUB may be greater than the read disturbance of a word line distant from the substrate SUB.

According to an exemplary embodiment of the inventive concept, if a read count of each of the zones Zone_1a to Zone_4a reaches a given threshold value, the reliability verification read operation may be performed on each of the zones Zone_1a to Zone_4a. For example, the reliability verification read operation may be performed on a zone close to the substrate SUB more frequently.

For example, if a read count associated with the word lines WL1 and WL2 of the first zone Zone_1a reaches a first threshold value N1, the reliability verification read operation may be performed on each of the word lines WL1 and WL2. If a read count associated with the word lines WL3, WL4, and WL5 of the second zone Zone_2a reaches a second threshold value N2, the reliability verification read operation may be performed on each of the word lines WL3, WL4, and WL5. In this case, the second threshold value N2 may be greater than the first threshold value N1.

If a read count associated with the word lines WL6 and WL7 of the third zone Zone_3a reaches a third threshold value N3, the reliability verification read operation may be performed on each of the word lines WL6 and WL7. In this case, the third threshold value N3 may be greater than the second threshold value N2. If a read count associated with the word line WL8 of the fourth zone Zone_4a reaches a fourth threshold value N4, the reliability verification read operation may be performed on the word line WL8. In this case, the fourth threshold value N4 may be greater than the third threshold value N3.

As described above, the word lines WL1 to WL8 may be classified into the zones Zone_1a to Zone_4a based on distances from the substrate SUB. If a read operation is performed on each of the zones Zone_1a to Zone_4a by a given frequency, the reliability verification read operation may be performed. For example, the number of read operations performed on each of the zones Zone_1a to Zone_4a means the number of read operations performed on one or more word lines included in each of the zones Zone_1a to Zone_4a.

If a result of the reliability verification read operation indicates that a zone includes a number of error bits not smaller than a reference value, the storage device 100 may perform a read reclaim to move all or a portion of data stored in the memory block BLKz to another memory block. With the above-described operation, the integrity of data of the storage device 100 may be secured. For example, a memory block (e.g., the memory block BLKz) where the reliability verification read operation is performed may be a selected memory block.

Figure 5:
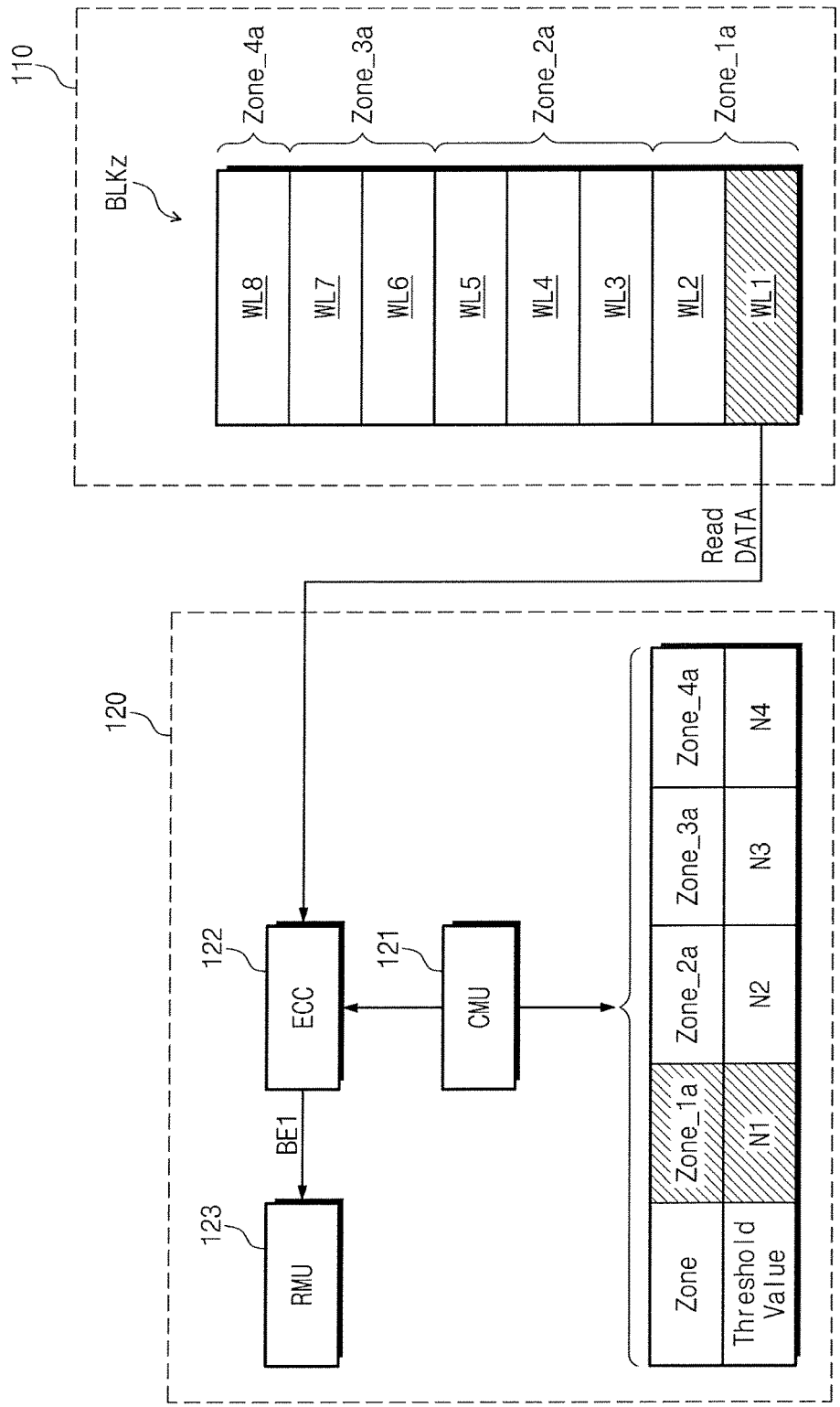
FIGS. 5 and 6 are block diagrams illustrating an operating method of the storage device of FIG. 1.
Figure 6:
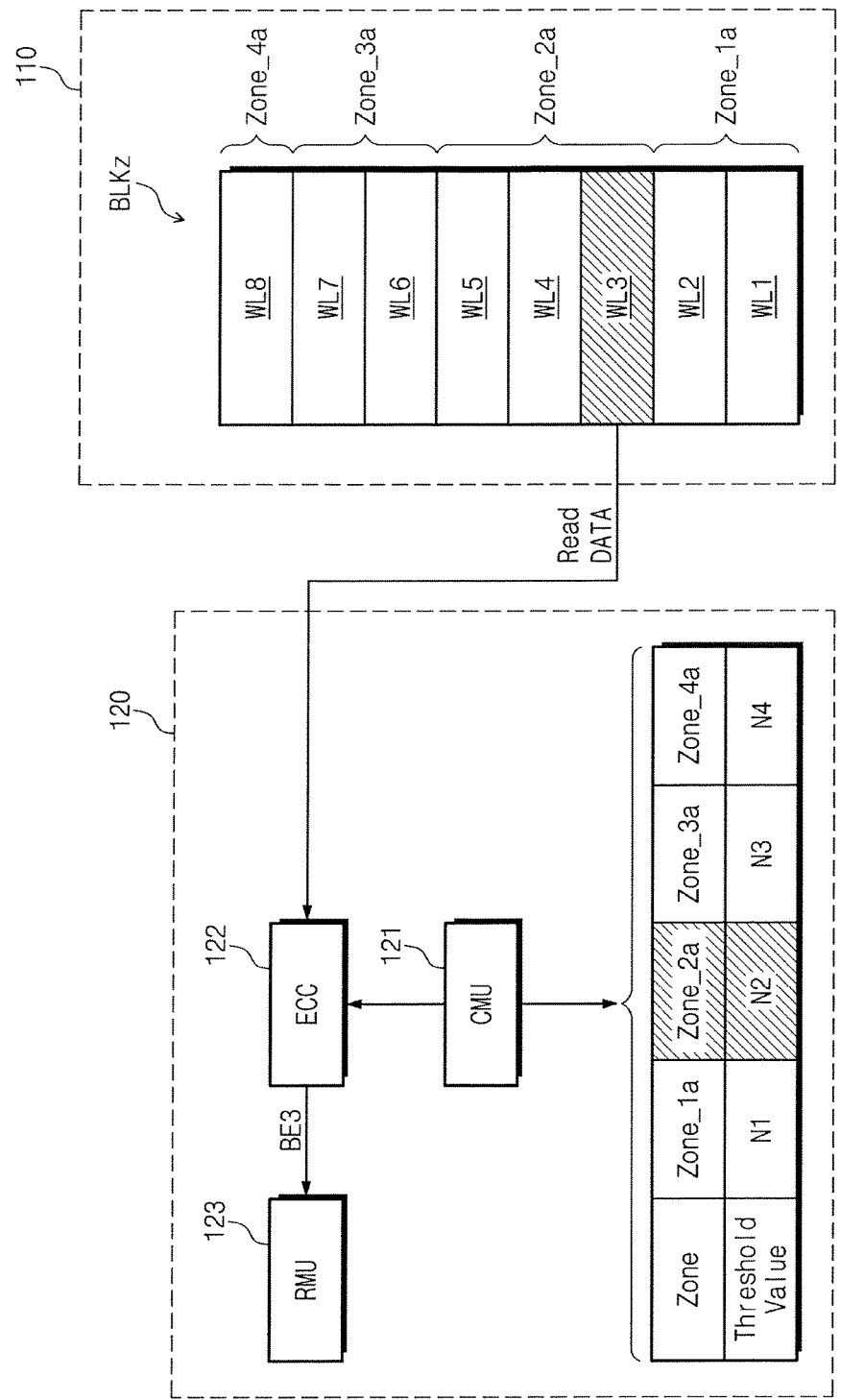

FIGS. 5 and 6 are block diagrams illustrating an operating method of a storage device of FIG. 1. Referring to FIGS. 1, 4, and 5, the count management unit 121 of the controller 120 may count the number of read commands received from the host device and may manage a read count. For example, if the read count associated with the word lines WL1 and WL2 of the first zone Zone_1a of the selected memory block BLKz reaches a first threshold value N1, the count management unit 121 may perform the reliability verification read operation on each of the word lines WL1 and WL2. For example, the controller 120 may count the number of read commands associated with all the word lines WL1 and WL2 and may compare the count result with the first threshold value N1.

The controller 120 may read data "DATA" from memory cells of the first word line WL1. For example, the data read from memory cells of the first word line WL1 may include an error bit(s). The ECC circuit 122 may correct an error based on the result of detecting the number of error bits of the read data. If the number of error bits of the read data is smaller than the reference number of error bits, the ECC circuit 122 may correct the error of the read data.

The count management unit 121 may perform the reliability verification read operation on the second word line WL2 in a manner the same as or similar to that performed on the first word line WL1.

If the number of error bits of the data read from the memory cells of the first word line WL1 exceeds the reference number of error bits, the ECC circuit 122 may provide error bit information BE1 to the reclaim management unit 123. For example, the error bit information BE1 may include information about the number of error bits of the read data. The reclaim management unit 123 may perform a read reclaim operation on the first word line WL1. However, the present inventive concept is not limited thereto. The reclaim management unit 123 may perform the read reclaim operation on the first and second word lines WL1 and WL2. In this case, the read reclaim operation may be performed on the word lines WL1 and WL2 in the same zone of Zone_1a. In an exemplary embodiment, the reclaim management unit 123 may perform a read reclaim operation on the first to eighth word lines WL1 to WL8. In this case, the read reclaim operation may be performed on all the word lines WL1 to WL8 in the selected block BLKz.

Referring to FIG. 6, the count management unit 121 may count the number of read commands received from the host device and may manage a read count. If a read count associated with the word lines WL3, WL4, and WL5 of the second zone Zone_2a reaches the second threshold value N2, the count management unit 121 may perform the reliability verification read operation on each of the word lines WL3, WL4, and WL5. The controller 120 may count the number of read commands associated with all the word lines WL3, WL4, and WL5 and may compare the count result with the second threshold value N2. For example, the number of read commands directed to the word lines WL3, WL4 and WL5 of the second zone Zone_2a is counted, and the count result is compared with the second threshold value N2.

The ECC circuit 122 may correct an error based on the result of detecting the number of error bits of the data read from the memory cells of the third word line WL3. If the number of error bits of the read data is less than the reference number of error bits, the ECC circuit 122 may correct an error of the read data.

The count management unit 121 may perform the reliability verification read operation on the fourth and fifth word lines WL4 and WL5 in a manner the same as or similar to that performed on the third word line WL3.

If the number of error bits of the data read from the memory cells of the third word line WL3 exceeds the reference number of error bits, the ECC circuit 122 may provide error bit information BE3 to the reclaim management unit 123. For example, the error bit information BE3 may include information about the number of error bits of the read data. The reclaim management unit 123 may perform the read reclaim operation on the third word line WL3. However, the present inventive concept is not limited thereto. For example, the reclaim management unit 123 may perform the read reclaim operation on the word lines WL3, WL4, and WL5 of the second zone Zone_2a. In this case, the read reclaim operation may be performed on the word lines WL3 to WL5 in the same zone of Zone_2a. In an exemplary embodiment, the reclaim management unit 123 may perform the read reclaim operation on all the word lines WL1 to WL8. In this case, the read reclaim operation may be performed on all the word lines WL1 to WL8 in the selected block BLKz.

As described with reference to FIGS. 5 and 6, if a read count associated with the third zone Zone_3a reaches the threshold value N3, the reliability verification read operation may be performed on word lines included in the third zone Zone_3a; if a read count associated with the fourth zone Zone_4a reaches the threshold value N4, the reliability verification read operation may be performed on word lines included in the fourth zone Zone_4a.

Figure 7:
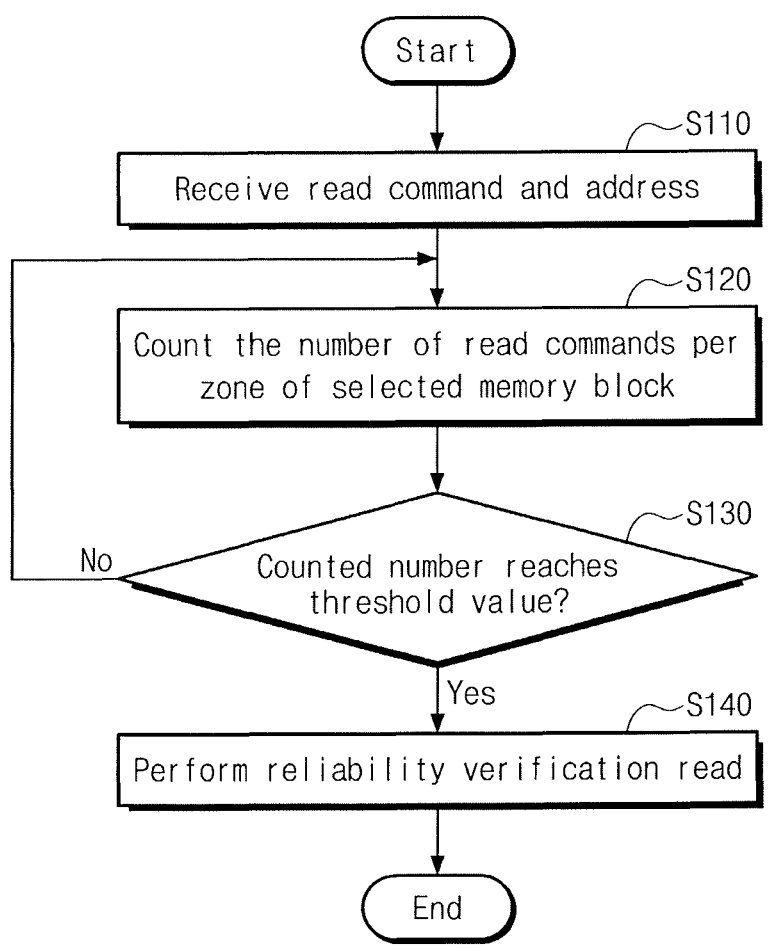
FIG. 7 is a flowchart illustrating an operating method of the storage device of FIG. 1.

FIG. 7 is a flowchart illustrating an operating method of the storage device of FIG. 1. Referring to FIGS. 1, and 5 to 7, in operation S110, a read command and a read address are received. For example, the read command and the read address may be provided from an external host device to the controller 120.

In operation S120, the controller 120 may count the number of read commands on each of the zones Zone_1a to Zone_4a of the selected memory block BLKz. For example, the controller 120 may manage a read count associated with each of the zones Zone_1a to Zone_4a.

In operation S130, the controller 120 may determine whether a read count associated with at least one of the zones Zone_1a to Zone_4a reaches a threshold value. For example, if a zone of which the read count reaches the threshold value is absent, the reliability verification read operation need not be performed. If a zone of which the read count reaches the threshold value exists, in operation S140, the reliability verification read operation may be performed.

For example, if a read count of the first zone Zone_1a reaches the first threshold value N1, the controller 120 may perform the reliability verification read operation on the word lines WL1 and WL2 included in the first zone Zone_1a. As such, if a read count reaches a given threshold value of zone, the controller 120 may perform the reliability verification read operation on the zone.

Figure 8:
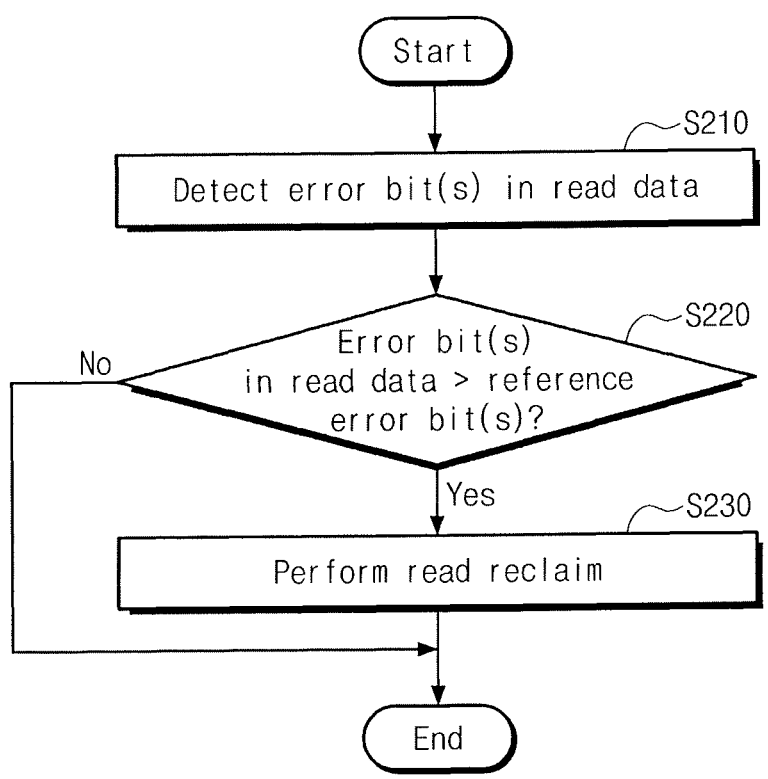
FIG. 8 is a flowchart illustrating a read reclaim method of the storage device of FIG. 1.

FIG. 8 is a flowchart illustrating a read reclaim method of a storage device of FIG. 1. Referring to FIGS. 1 and 4 to 7, in operation S210, the controller 210 may detect an error bit(s) from read data. For example, the controller 120 may read data from the nonvolatile memory device 110 through the reliability verification read operation and may detect an error bit(s) of the read data.

In operation S220, the controller 120 may compare the number of error bits of the read data with the reference number of error bits. For example, if the number of error bits of the read data is less than the reference number of error bits, the read reclaim operation need not be performed. If the number of error bits of the read data exceeds the reference number of error bits, in operation S230, the controller 120 performs the read reclaim operation. If the number of error bits of the read data exceeds the reference number of error bits, the read data is determined as uncorrectable by the ECC circuit 122.

Referring to FIGS. 7 and 8, the controller 120 according to an exemplary embodiment of the inventive concept may classify word lines of a selected memory block into a plurality of zones Zone_1a to Zone_4a for management. The controller 120 may manage a read count of each of the zones Zone_1a to Zone_4a and may perform the reliability verification read operation on each of the zones Zone_1a to Zone_4a based on the read count. The controller 120 may perform the read reclaim operation of the selected memory block based on the number of error bits obtained through the reliability verification read operation. With the above-described operation, the integrity of data of the storage device 100 may be increased.

Figure 9:
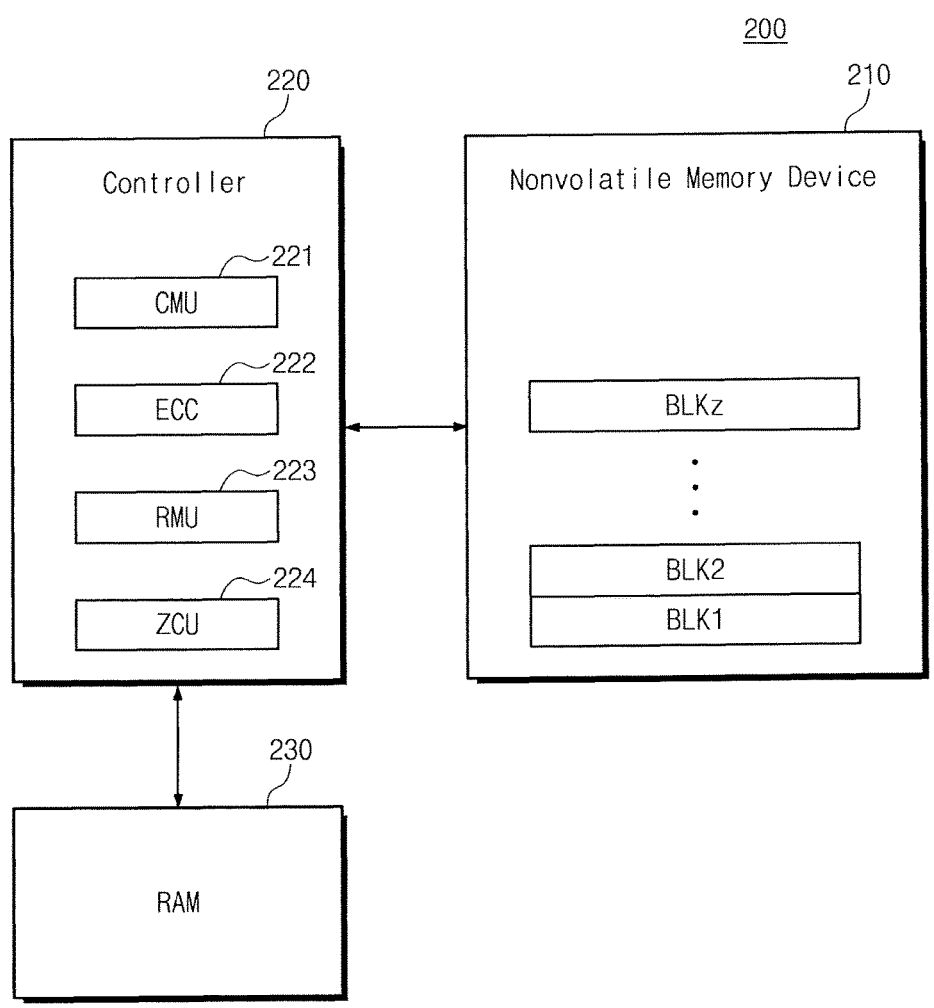
FIG. 9 is a block diagram illustrating a storage device according to an exemplary embodiment of the inventive concept.

FIG. 9 is a block diagram illustrating a storage device according to an exemplary embodiment of the inventive concept. Referring to FIG. 9, a storage device 200 may include a nonvolatile memory device 210, a controller 220, and a RAM 230. The controller 220 may include a count management unit 221, an ECC circuit 222, a reclaim management unit 223, and a zone correction unit 224. The storage device 200 may be implemented with one of the SSD or the SD card.

The controller 220 may transmit an address and a command to the nonvolatile memory device 210. The controller 220 may exchange data with the nonvolatile memory device 210. The nonvolatile memory device 210, the count management unit 221, the ECC circuit 222, the reclaim management unit 223, and the RAM 230 may be similar to or the same as the nonvolatile memory device 110, the count management unit 121, the ECC circuit 122, the reclaim management unit 123, and the RAM 130 of FIG. 1, and thus a detailed description thereof will not be repeated here.

The zone correction unit 224 may be implemented in the form of hardware or software or in a hybrid form.

In the hardware form, the zone correction unit 224 may include one or more digital and/or analog circuits to perform operations to be described later. In the software form, the zone correction unit 224 may include one or more instruction codes for performing operations to be described later. The instruction codes may be complied or translated to an instruction set by one or more processors included in the controller 220 for processing.

The zone correction unit 224 may correct zones of a memory block. For example, if the number of program/erase (P/E) cycles of a memory block reaches a reference value, the zone correction unit 224 may check the degree of deterioration of word lines of the memory block. The degree of deterioration may be checked based on a temperature, a program time, current consumption, and a bit error rate of each word line.

A ratio of error bits to a read count may increase as the number of P/E cycles of the memory block increases. For example, since the degree of deterioration of the memory block increases as the number of P/E cycles of the memory block increases, the probability that an error bit is generated may increase.

According, if the number of P/E cycles of the memory block reaches a reference value, the zone correction unit 224 may correct zones of the memory block based on the degree of deterioration of word lines. In this case, the corrected zones may be called "new zones". For example, a word line included in each new zone may be different from a word line included in each of previous zones.

The zone correction unit 224 may store information about the new zones in the RAM 230. The present inventive concept is not limited thereto. For example, to cope with the sudden power-off (SPO) of the storage device 200, the zone correction unit 224 may store information about the new zones in a specific area (e.g., a security area) of memory blocks of the nonvolatile memory device 210.

Figure 10:
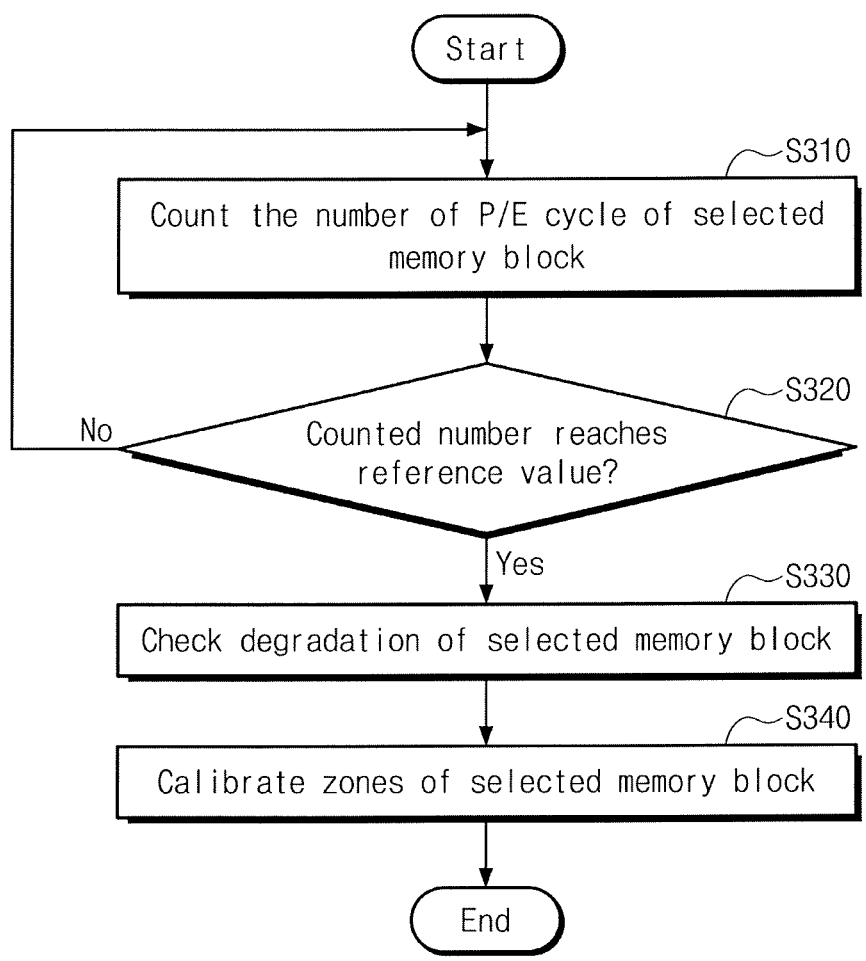
FIG. 10 is a flowchart illustrating a method of adjusting a plurality of zones of the storage device of FIG. 8.

The storage device 200 according to an exemplary embodiment of the inventive concept may manage zones of memory blocks based on P/E cycles. If the number of P/E cycles reaches the reference value, the storage device 200 may check the degree of deterioration of word lines to correct a range of zones FIG. 10 is a flowchart illustrating a method of adjusting a plurality of zones of the storage device of FIG. 8. Referring to FIGS. 9 and 10, in operation S310, the controller 220 may check the number of P/E cycles of a selected memory block.

In operation S320, the zone correction unit 224 of the controller 220 may compare the number of P/E cycles with a reference value. If the number of P/E cycles does not reach the reference value, the zone correction unit 224 need not check the degree of deterioration of the selected memory block. If the number of P/E cycles reaches the reference value, in operation S330, the zone correction unit 224 of the controller 220 may check the degree of deterioration of the selected memory block. For example, the zone correction unit 224 may check the degree of deterioration of the selected memory block based on a temperature, a program speed, the amount of current, and a bit error rate of the selected memory block.

In operation S340, the zone correction unit 224 of the controller 220 may correct zones of the selected memory block based on the degree of deterioration of word lines in the selected memory block.

Figure 11:
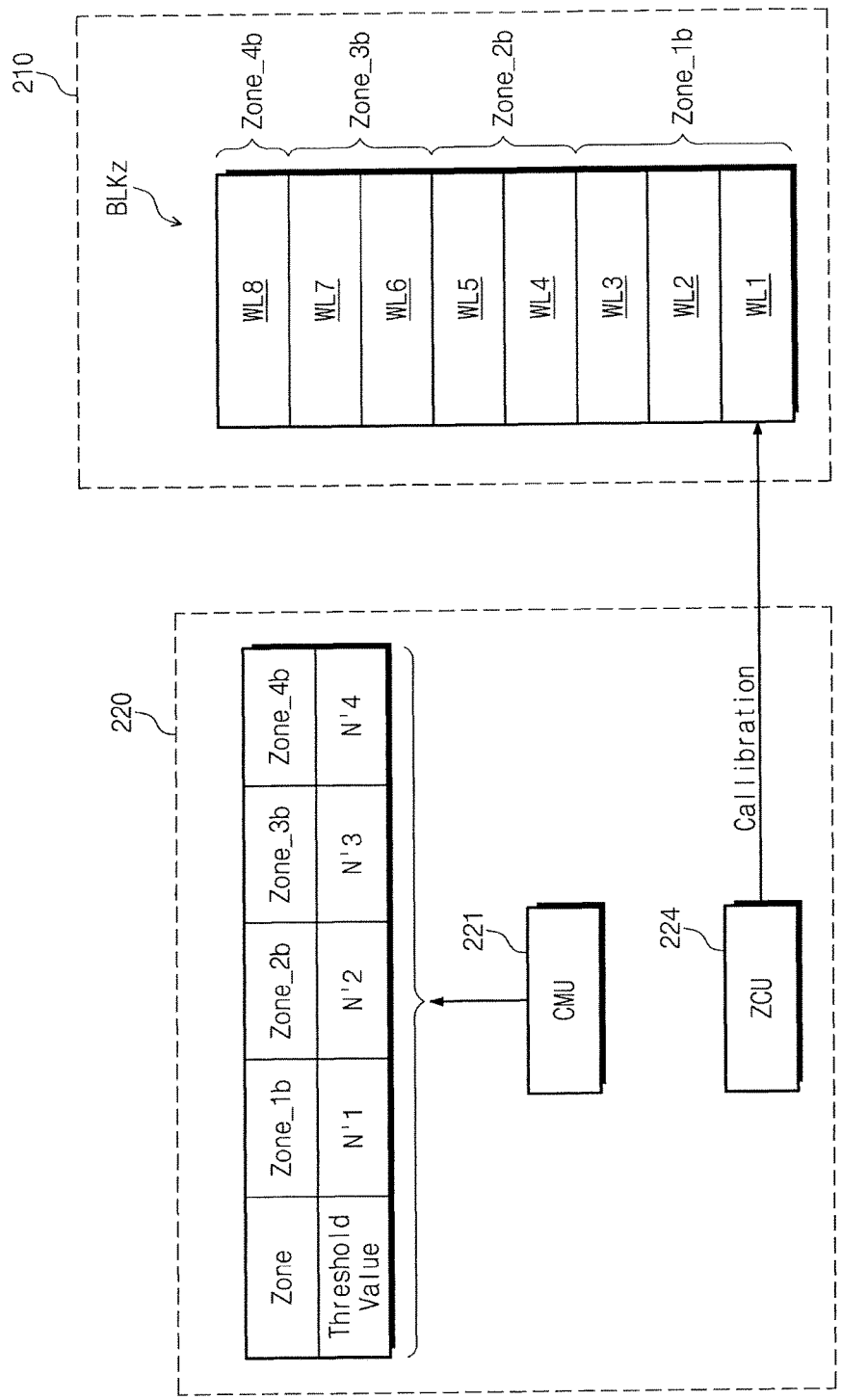
FIG. 11 is a block diagram illustrating a memory block divided into new zones, according to an exemplary embodiment of the inventive concept.

FIG. 11 is a block diagram illustrating a memory block divided into new zones, according to an exemplary embodiment of the inventive concept. Referring to FIGS. 4 and 9 to 11, the memory block BLKz may be corrected to a plurality of new zones Zone_1b to Zone_4b. With the correction, previous zones Zone_1a to Zone_4a may be changed to the new zones Zone_1b to Zone_4b. For example, the zone correction unit 224 of the controller 220 may correct zones of the memory block BLKz to the new zones Zone_1b to Zone_4b based on the degree of deterioration of word lines WL1 to WL8 in the memory block BLKz.

For example, referring to FIG. 11, word lines WL1 and WL2 included in a previous first zone Zone_1a may be different from word lines WL1, WL2, and WL3 included in the new first zone Zone_1b. Word lines WL3, WL4, and WL5 included in a previous second zone Zone_2a may be different from word lines WL4 and WL5 included in the new second zone Zone_2b. Word lines WL6 and WL7 included in a previous third zone Zone_3a and a word line WL8 included in a previous fourth zone Zone_4a may be the same as word lines WL6 and WL7 included in the new third zone Zone_3b and a word line WL8 included in the new fourth zone Zone_4b. This may be only exemplary. The new zones Zone_1b to Zone_4b may be corrected to various word line ranges.

Each of the remaining memory blocks BLK1 to BLKz-1 of the nonvolatile memory device 110 may include the new zones Zone_1b to Zone_4b that are similar to or the same as those of the memory block BLKz.

For example, a memory block may deteriorate as the number of P/E cycles increases. Also, word lines closer to the substrate SUB may deteriorate faster. For this reason, the new first zone Zone_1b on which the reliability verification read operation is performed at the highest frequency may include more word lines than the first zone Zone_1a. For example, the new first zone Zone_1b may include the first, second, and third word lines WL1, WL2, and WL3. If a read operation is performed on the word lines WL1, WL2, and WL3 of the new first zone Zone_1b by a new first threshold value N'1. The count management unit 221 may perform the reliability verification read operation on each of the word lines WL1, WL2, and WL3. In this case, the new first threshold value N'1 may be smaller than or equal to the previous first threshold value N1.

If a read operation is performed on the word lines WL4 and WL5 of the new second zone Zone_2b by a new second threshold value N'2, the count management unit 221 may perform the reliability verification read operation on each of the word lines WL4 and WL5. In this case, the new second threshold value N'2 may be greater than the new first threshold value N'1 and smaller than or equal to the previous second threshold value N2.

If a read operation is performed on the word lines WL6 and WL7 of the new third zone Zone_3b by a new third threshold value N'3, the count management unit 221 may perform the reliability verification read operation on each of the word lines WL6 and WL7. In this case, the new third threshold value N'3 may be greater than the new second threshold value N'2 and smaller than or equal to the previous third threshold value N3.

If a read operation is performed on the word line WL8 of the new fourth zone Zone_4a by a new fourth threshold value N'4, the count management unit 221 may perform the reliability verification read operation on each of the word line WL8. In this case, the new fourth threshold value N'4 may be greater than the new third threshold value N'3 and smaller than or equal to the previous third threshold value N3.

For this reason, the reliability verification read operation may be performed on the new zones Zone_1b to Zone_4b more frequently than the zones Zone_1a to Zone_4a.

Figure 12:
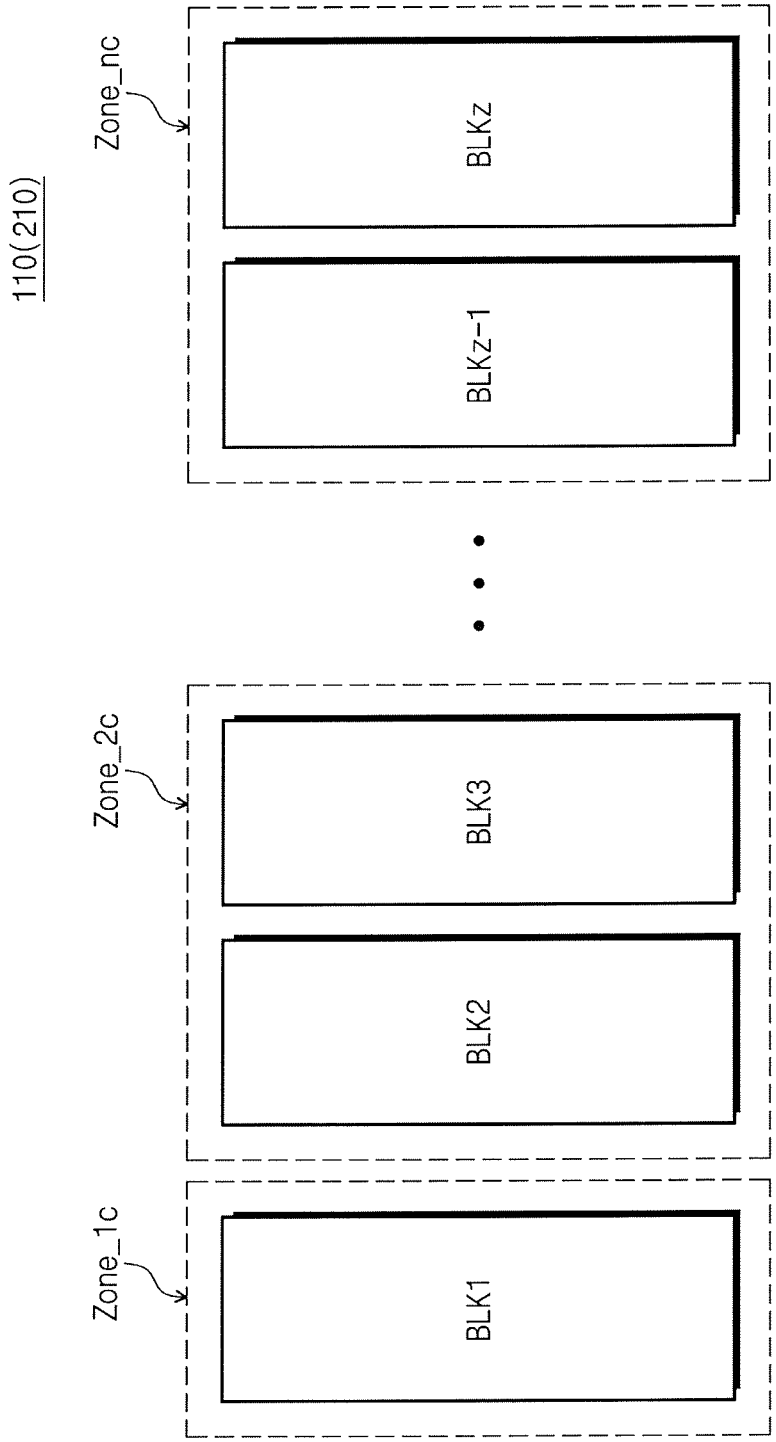
FIG. 12 is a block diagram illustrating memory blocks classified into a plurality of zones, according to an exemplary embodiment of the inventive concept.

FIG. 12 is a block diagram illustrating memory blocks classified into a plurality of zones, according to an exemplary embodiment of the inventive concept. Referring to FIGS. 1, 9, and 12, the storage device 100/200 may classify the memory blocks BLK1 to BLKz into a plurality of zones Zone_1c to Zone_nc based on deterioration characteristics of the memory blocks BLK1 to BLKz.

For example, the controller 120/220 may perform a reliability verification read operation based on the number of read operations performed on each of the zones Zone_1c to Zone_nc. For example, if the number of read operations performed on each of the zones Zone_1c to Zone_nc reaches a threshold value, the controller 120/220 may perform the reliability verification read operation. With the reliability verification read operation, data of a memory block where the number of error bits exceeding the reference number of error bits occurs may be read reclaimed to another memory block. For example, the number of read operations performed on each of the zones Zone_1c to Zone_nc means the number of read operations performed on all of one or more memory blocks in each of the zones Zone_1c to Zone_nc.

Figure 13:
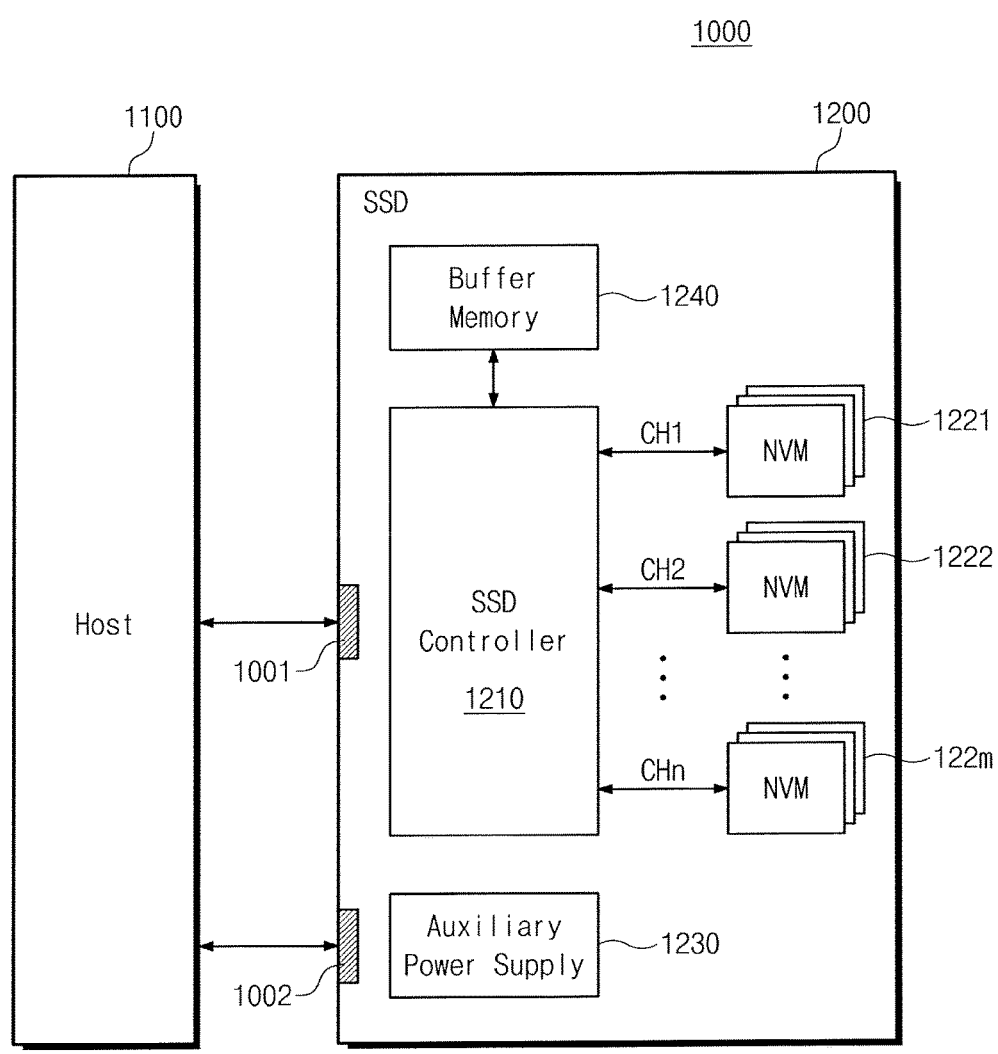
FIG. 13 is a block diagram schematically illustrating a solid state drive according to an exemplary embodiment of the inventive concept.

FIG. 13 is a block diagram illustrating a SSD according to an exemplary embodiment of the inventive concept. A SSD system 1000 may include a host 1100 and an SSD 1200. The SSD 1200 may exchange signals with the host 1100 through a signal connector 1001 and may be supplied with electric power PWR through a power connector 1002. The SSD 1200 may include an SSD controller 1210, a plurality of flash memories 1221 to 122m, an auxiliary power supply 1230, a buffer memory 1240, and a wireless module.

The SSD controller 1210 may control the flash memories 1221 to 122m in response to the signal SIG from the host 1100. In an exemplary embodiment, the SSD controller 1210 may perform the reliability verification read operation on the flash memories 1221 to 122m based on configurations described with reference to FIGS. 1 to 9. The SSD controller 1210 may perform the read reclaim operation of the flash memories 1221 to 122m based on the result of the reliability verification read operation.

The auxiliary power supply 1230 is connected to the host 1100 via the power connector 1002. The auxiliary power supply 1230 may receive the electric power PWR from the host 1100 and may be charged by the electric power. When the electric power PWR is not smoothly supplied from the host 1100, the auxiliary power supply 1230 may power the SSD system 1000. The auxiliary power supply 1230 may be placed inside or outside the SSD 1200. For example, the auxiliary power supply 1230 may be placed on a main board to supply auxiliary electric power to the SSD 1200.

The buffer memory 1240 operates as a buffer memory of the SSD 1200. For example, the buffer memory 1240 may temporarily store data received from the host 1100 or from the flash memories 1221 to 122m or may temporarily store metadata (e.g., a mapping table) of the flash memories 1221 to 122m. The buffer memory 1240 may include volatile memories such as a DRAM, a synchronous DRAM (SDRAM), a double data rate (DDR) SDRAM, a low power DDR (LPDDR) SDRAM, and a static RAM (SRAM) or nonvolatile memories such as a FRAM a ReRAM, and a PRAM.

Figure 14:
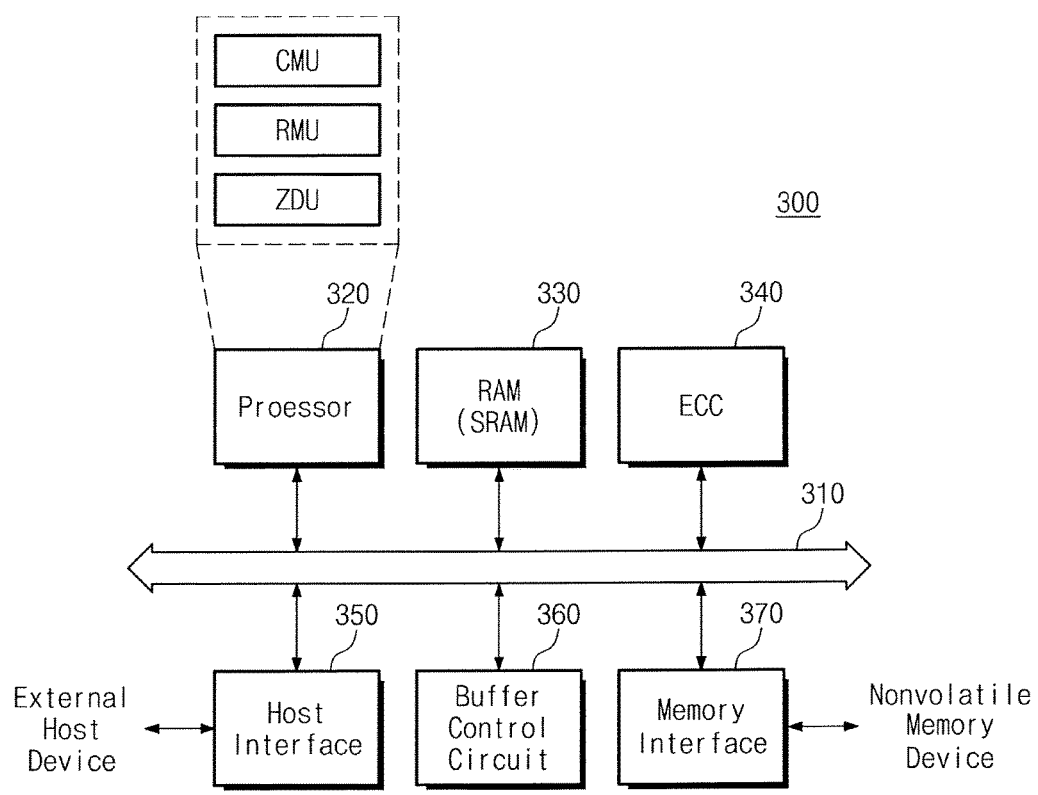
FIG. 14 is a block diagram illustrating a controller according to an exemplary embodiment of the inventive concept.

FIG. 14 is a block diagram illustrating a controller according to an exemplary embodiment of the inventive concept. Referring to FIGS. 1, 9, and 14, the controller 120/220 may include components similar to or the same as those of a controller 300. The controller 300 includes a bus 310, a processor 320, a RAM 330, an ECC circuit 340 (or the ECC circuit 122), a host interface 350, a buffer control circuit 360, and a memory interface 370.

The bus 310 may be configured to provide a channel among elements of the controller 300.

The processor 320 may control overall operations of the controller 300 and may execute a logical operation. The processor 320 may communicate with an external host device through the host interface 350, may communicate with the nonvolatile memory device 110/120 through the memory interface 370, and may communicate with the RAM 130/230 through the buffer control circuit 360. The processor 320 may control the storage device 100/200 by using the RAM 330 as a working memory, a cache memory, or a buffer memory.

At least one of the count management unit CMU, the reclaim management unit RMU, and the zone correction unit ZDU may be implemented in the form of software driven by the processor 320, such as firmware, an operating system, and an application. As another example, at least one of the count management unit CMU, the reclaim management unit RMU, and the zone correction unit ZDU may be implemented with hardware, such as circuitry or an intellectual property (IP), in the interior of the processor 320. Alternatively, at least one of the count management unit CMU, the reclaim management unit RMU, and the zone correction unit ZDU may be implemented in the form of a combination of hardware and software in connection with the processor 320. Alternatively, at least one of the count management unit CMU, the reclaim management unit RMU, and the zone correction unit ZDU may be implemented with a separate module that is separated from the processor 320.

The RAM 330 may be used as a working memory, a cache memory, or a buffer memory of the processor 320. The RAM 330 may store codes and commands that the processor 320 will execute. The RAM 330 may store data processed by the processor 320. The RAM 330 may include an SRAM.

The ECC circuit 340 (or the ECC circuit 122) may perform error correction. The ECC circuit 340 (or the ECC circuit 122) may perform error correction encoding based on data to be written in the nonvolatile memory device 110/120 through the memory interface 370. The error correction encoded data may be provided to the nonvolatile memory device 110/120 through the memory interface 370. The ECC circuit 340 (or the ECC circuit 122) may perform error correction decoding on data received through the memory interface 370 from the nonvolatile memory device 110/220. In an exemplary embodiment, the ECC circuit (or the ECC circuit 122) may be included in the memory interface 370 as a component of the memory interface 370.

The host interface 350 may be configured to communicate with the external host device under control of the processor 320. The host interface 350 may be configured to convey communications by using at least one of various communication manners, such as a universal serial bus (USB), serial AT attachment (SATA), serial attached SCSI (SAS), high speed interchip (HSIC), a small computer system interface (SCSI), peripheral component interconnection (PCI), PCI express (PCIe), nonvolatile memory express (NVMe), universal flash storage (UFS), secure digital (SD), a multimedia card (MMC), an embedded MMC (eMMC), a dual in-line memory module (DIMM), a registered DIMM (RDIMM), and a load reduced DIMM (LRDIMM).

The buffer control circuit 360 may control the RAM 130/230 under control of the processor 320

The memory interface 370 may be configured to communicate with the nonvolatile memory device 110/120 under control of the processor 320. As described with reference to FIG. 1, the memory interface 370 may convey a command, an address, and data to the nonvolatile memory device 110/120 through the input/output channel. The memory interface 370 may convey a control signal to the nonvolatile memory device 110/120 through the control channel.

In an exemplary embodiment, in the case where the storage device 100/200 does not include the RAM 130/230, the controller 300 may not include the buffer control circuit 360.

In an exemplary embodiment, the processor 320 may control the controller 300 by using codes. The processor 320 may load codes from a nonvolatile memory device (e.g., a read only memory) that is implemented in the interior of the controller 300. As another example, the processor 320 may load codes from the nonvolatile memory device 110/120 through the memory interface 370.

In an exemplary embodiment, the bus 310 of the controller 300 may be divided into a control bus and a data bus. The data bus may transmit data in the interior of the controller 300, and the control bus may transmit control information, such as a command and an address, in the interior of the controller 300. The data bus and the control bus may be independent of each other to prevent mutual interference or influence. The data bus may be connected with the host interface 350, the buffer control circuit 360, the ECC circuit 340 (or the ECC circuit 122), and the memory interface 370. The control bus may be connected with the processor 320, the RAM 330, the host interface 350, the buffer control circuit 360, and the memory interface 370.

According to an exemplary embodiment of the inventive concept, a memory block may be managed according to the degree of deterioration of word lines under the condition that the memory block is divided into a plurality of groups, and thus a storage device with improved performance may be provided.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A storage device comprising:
a nonvolatile memory device comprising a plurality of memory blocks,
wherein each of the plurality of memory blocks is divided into a plurality of zones and is formed on a substrate, and
wherein each of the plurality of zones comprises one or more word lines; and
a controller configured to:
perform a reliability verification read operation on a first zone of the plurality of zones of a memory block selected from the plurality of memory blocks if a number of read operations performed on the first zone reaches a first threshold value; and
perform the reliability verification read operation on a second zone of the plurality of zones of the selected memory block if a number of read operations performed on the second zone reaches a second threshold value.

2. The storage device of claim 1,
wherein the controller is further configured to:
detect a number of error bits of data read from the first zone through the reliability verification read operation on the first zone, and
perform a read reclaim operation on data stored in the first zone based on a number of error bits.

3. The storage device of claim 1,
wherein the first zone of the plurality of zones is closer to the substrate than the second zone of the plurality of zones, and
wherein the second threshold value is greater than the first threshold value.

4. The storage device of claim 1,
wherein the first zone and the second zone of each of the selected memory block are stacked in a direction perpendicular to the substrate.

5. The storage device of claim 4,
wherein a distance between the first zone and the substrate is shorter than a distance between the second zone and the substrate.

6. The storage device of claim 1,
wherein the first zone of the plurality of zones is closer to the substrate than the second zone of the plurality of zones, and
wherein the controller is further configured to perform the reliability verification read operation on the first zone more frequently than to perform the reliability verification read operation on the second zone.

7. The storage device of claim 1,
wherein the controller is further configured to:
detect a number of error bits of data read from the second zone through the reliability verification read operation on the second zone, and
perform a read reclaim operation for moving data stored in the selected memory block to another memory block based on a number of error bits.

8. A storage device comprising:
a nonvolatile memory device comprising a plurality of memory blocks,
wherein each of the plurality of memory blocks is divided into a plurality of zones and is formed on a substrate, and
wherein each of the plurality of zones comprises one or more word lines; and
a controller configured to:
perform a reliability verification read operation on a first zone of the plurality of zones of a memory block selected from the plurality of memory blocks if a number of read operations performed on the first zone reaches a first threshold value; and
perform the reliability verification read operation on a second zone of the plurality of zones of the selected memory block if a number of read operations performed on the second zone reaches a second threshold value,
wherein the controller is configured to classify the plurality of memory blocks into a plurality of new zones based on a number of program/erase cycles of the selected memory block.

9. The storage device of claim 8,
wherein the controller is configured to set new threshold values to perform the reliability verification read operation on the plurality of new zones.

10. The storage device of claim 8,
wherein the controller is configured to perform the reliability verification read operation on each of the plurality of new zone more frequently than to perform the reliability verification read operation on each of the plurality of zones.

11. The storage device of claim 8,
wherein if a number of program/erase cycles of the selected memory block reaches a reference value, the controller is configured to set the plurality of new zones based on a degree of deterioration of word lines of the selected memory block.

12. The storage device of claim 11,
wherein the controller is configured to measure the degree of deterioration based on a temperature, a program speed, and bit error rate of the word lines of the selected memory block.

13. A storage device comprising:
a nonvolatile memory device including a plurality of word lines vertically stacked on a substrate,
wherein each of the plurality of word lines is associated with one of a plurality of zones divided according to a height of each of the plurality of word lines from the substrate; and
a controller comprising a count management unit storing a plurality of threshold values each of which is associated with one of the plurality of zones, generating a plurality of read counts by counting a read command for each of the plurality of zones and performing a reliability verification read operation on one or more word lines associated with a first zone of the plurality of zones if a read count of the first zone is greater than a threshold value of the first zone.

14. The storage device of claim 13,
wherein the controller further comprising:
an error correction code (ECC) circuit determining whether data read from each of the one or more word lines associated with the first zone in the reliability verification read operation is correctable; and
a reclaim management unit performing a read reclaim operation on a first word line of the one or more word lines associated with the first zone if the first word line is determined as uncorrectable by the ECC circuit.

15. The storage device of claim 13,
wherein the nonvolatile memory device includes a security area for storing information of a bad area, and
wherein zone information of the plurality of zones is stored in the security area of the nonvolatile memory device.

16. The storage device of claim 13,
wherein if a first zone of the plurality of zones is closer to the substrate than a second zone of the plurality of zones, a first threshold value of the plurality of threshold values associated with the second zone is greater than a first threshold value of the plurality of threshold values associated with the first zone.

17. The storage device of claim 13,
wherein the nonvolatile memory device further comprises a pillar penetrating the plurality of word lines and having a decreasing width toward the substrate.

* * * * *